(12) United States Patent
Gonzalez et al.

(10) Patent No.: US 6,359,310 B1
(45) Date of Patent: *Mar. 19, 2002

(54) SHALLOW DOPED JUNCTIONS WITH A VARIABLE PROFILE GRADATION OF DOPANTS

(75) Inventors: Fernando Gonzalez; Randhir Thakur, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,515

(22) Filed: Nov. 20, 1998

Related U.S. Application Data

(63) Continuation of application No. 08/654,573, filed on May 29, 1996, now abandoned.

(51) Int. Cl.[7] ................... H01L 29/76; H01L 29/94; H01L 27/088
(52) U.S. Cl. ............... 257/344; 257/408; 257/900
(58) Field of Search ............... 257/288, 344, 257/408, 900

(56) References Cited

U.S. PATENT DOCUMENTS

| | | | |
|---|---|---|---|
| 4,769,686 A | * 9/1988 | Horiuchi et al. | 257/344 |
| 4,835,740 A | * 5/1989 | Sato | 257/344 |
| 4,907,048 A | 3/1990 | Huang | 257/346 |
| 5,006,477 A | 4/1991 | Farb | 438/231 |
| 5,045,901 A | 9/1991 | Komori et al. | 257/344 |
| 5,091,763 A | 2/1992 | Sanchez | 257/344 |
| 5,352,914 A | 10/1994 | Farb | 257/336 |
| 5,434,440 A | 7/1995 | Yoshitomi et al. | 257/344 |
| 5,530,276 A | * 6/1996 | Iwasa | 257/382 |

OTHER PUBLICATIONS

Shu Qin, et al., "Plasma Immersion Ion Implantation Doping Experiments for Microelectronics," pp. 962–968, J. Vac. Sci. Technol. B 12(2), Mar./Apr. 1994.

* cited by examiner

Primary Examiner—Steven Loke
(74) Attorney, Agent, or Firm—Workman, Nydegger & Seeley

(57) ABSTRACT

Disclosed is an electrical device including a process for forming a shallow junction with a variable concentration profile gradation of dopants. The process of the present invention comprises, first providing and masking a surface on an in-process integrated circuit wafer on which the shallow junction is to be formed. Next, a low ion velocity and low energy ion bombardment plasma doping or PLAD operation is conducted to provide a highly doped inner portion of a shallow junction. In a further step, a higher ion velocity and energy conventional ion bombardment implantation doping operation is conducted using a medium power implanter to extend the shallow junction boundaries with a lightly doped outer portion. An anneal step follows. The result is a shallow junction with a variable concentration profile gradation of dopant. The junction is suitable for forming source and drain regions in MOS transistors, especially where a contact or interconnect is intended to engage the source and drain regions. The variable concentration profile gradation of dopants helps to maintain proper threshold voltage levels and reduces reverse bias current leakage.

15 Claims, 2 Drawing Sheets

SHALLOW DOPED JUNCTIONS WITH A VARIABLE PROFILE GRADATION OF DOPANTS

RELATED APPLICATIONS

This is a continuation of U.S. patent application Ser. No. 08/654,573, filed on May 29, 1996, titled "Shallow Doped Junctions with a Variable Profile Gradation of Dopants and Method of Forming Same", now abandoned.

BACKGROUND OF THE INVENTION

1. The Field of the Invention

The present invention is directed to the manufacture of integrated circuits. More particularly, the present invention is directed to shallow junctions formed on in-process integrated circuit wafers and to methods of forming the shallow junctions using plasma doping.

2. The Relevant Technology

The semiconductor industry is in the midst of a movement toward greater integrated circuit densification and miniaturization. Resulting from this movement is the development of highly compact and efficient semiconductor devices, attended by an increase in the complexity and number of such semiconductor devices that can now be successfully aggregated on a single integrated circuit wafer. These benefits have in turn resulted in the availability of more compact and efficient integrated circuits, and in the lower cost of these integrated circuits.

The greater miniaturization and densification of semiconductor devices, including resistors, capacitors, diodes, and transistors, has been achieved, in part, by a reduction in the scale of the various components of the semiconductor devices. Among the components which have been reduced in scale as part of the miniaturization and densification movement are junctions which are formed by doping silicon substrates located on integrated circuit wafers. These junctions are used to form source and drain regions of MOS transistors, among other things, and comprise regions of silicon which are doped with dopants such as boron and phosphorous. The dopants allow silicon, normally only a semiconducting material, to conduct current through the addition of either electrons or electron holes, depending on the dopant type.

Reducing the depth of a junction in the silicon substrate helps in producing an integrated circuit with a resultant high circuit density, high speed, and low power consumption, and thereby aids in the miniaturization and densification of integrated circuits.

One area of recent progress in the formation of junctions is the development of a doping process known as plasma doping, or "PLAD." PLAD is a process involving the use of a plasma to assist in doping at a lower ion bombardment velocity and energy than conventional ion bombardment implantation doping processes which do not operate in a plasma. The plasma in the PLAD operation is biased with an energy relative to the silicon substrate that drives the dopants into the silicon substrate. PLAD results in a shallow doped junction that has a higher concentration of dopants than can be provided by conventional ion bombardment implantation doping processes. With PLAD processing, the shallow and heavily doped junctions allow the contacts or interconnects to be made correspondingly small. The higher concentration of dopants at the surface of the junction has an advantageous resistivity where the junction is connected to other structures through a contact or interconnect. When so doing, the shallow junction with a high concentration of dopants forms an interface with the contact or interconnect that has a lower resistivity than would be otherwise formed.

The shallow junction with a high dopant concentration formed in the PLAD process allows greater miniaturization and densification of the integrated circuit being formed, due to the capability of forming a contact or interconnect to the junction with a high degree of miniaturization and yet a low resistance interface. Nevertheless, the PLAD processes used to produce shallow junctions still exhibit certain problems.

Several of the problems encountered with PLAD processes are illustrated by the MOS transistor structure under formation in FIG. 1. FIG. 1 shows a step in the process of forming a MOS transistor structure in which a gate region 14 has been formed on a semiconductor substrate 10. Portions of semiconductor substrate 10 at the sides of gate region 14 have been doped through a gate oxide layer 12 with a PLAD process. The PLAD process has formed junctions 16 which are to serve as source and drain regions on the completed MOS transistor. Junctions 16 exhibit a high doping concentration that is relatively consistent and terminates abruptly at a bottom component 16a of each junction 16.

As PLAD is not highly selective of the atoms being driven into silicon substrate 10, heavier atoms within a carrier gas are driven into silicon substrate 10 with a greater force than dopant atoms, and are consequently driven to a greater depth. This inconsistency in depth causes a jagged unevenness to bottom component 16a of junctions 16. Junctions 16 also have a dopant concentration gradient that terminates abruptly at edges 16a. The abrupt dopant concentration gradient termination, together with unevenness of bottom component is 16a, cause an undesirable increase in reverse bias current leakage. Reverse bias current leakage causes a drain of power through the integrated circuit when finished, a problem which is at odds with the low power requirements of modem integrated circuit applications.

The abrupt dopant concentration gradient termination at bottom component 16a of junction 16 can affect yield when forming a MOS transistor, in that a high amount of dopants at a greater depth may cause bottom component 16a of junctions 16 to substantially underlap gate region 14. The underlap of junctions below the gate is caused by a process known as out diffusion. When junction underlap occurs, there is a decrease in the distance between junctions 16. The result of junction underlap is a high threshold voltage, which is the voltage required to cause the MOS transistor to conduct current. A high threshold voltage is generally undesirable in MOS transistors.

One method used in the prior art for solving the problem of excessive junction underlap has been to form polysilicon spacers on the sides of the gate region at the periphery thereof, such as spacers 18 of FIG. 2. Spacers 18 are formed by conventional processes at the edge of gate region 14 prior to PLAD. Spacers 18 further the distance between junctions 16 and prevent junction underlap below gate region 14, thus maintaining a low threshold voltage. Nevertheless, the use of spacers 18 does not solve the problems of reverse bias current leakage. The formation of spacers also adds processing steps and thus throughput time to the integrated circuit formation process.

From the above discussion, it is seen that a need exists in the art for an improved method of forming shallow junctions on semiconductor substrates. Specifically, an improved method of forming shallow junctions is needed which has the PLAD benefits of shallower junctions with higher concentrations of dopants, without the PLAD constraints of junction underlap, jagged unevenness of the bottom component of the junctions, and abrupt dopant concentration gradient termination. Such an improved method would be an aid in the continued formation of more highly miniaturized and densified integrated circuits.

SUMMARY AND OBJECTS OF THE INVENTION

The present invention seeks to resolve the above and other problems which have been experienced in the art. More particularly, the present invention constitutes an advancement in the art by providing a method of forming shallow junctions on silicon substrates of integrated circuit wafers which achieves each of the objects listed below.

It is an object of the present invention to provide a method of forming shallow, heavily doped junctions on silicon substrates of integrated circuit wafers in order to provide smaller, more efficient transistors, diodes, resistors, and other semiconductor devices.

It is another object of the present invention to provide such a method of forming shallow junctions which utilizes PLAD.

It is further an object of the present invention to provide such a method which remedies rough and jagged unevenness of the bottom component of the junctions, abrupt dopant concentration gradient termination of the junctions, and high reverse bias current leakage which result from PLAD formation of junctions.

To achieve the foregoing objects, and in accordance with the invention as embodied and broadly described herein in the preferred embodiment, a method is provided for forming a shallow junction with a variable profile gradation of dopants.

The first step of the method of the present invention comprises providing a semiconductor wafer having a surface on which to form the shallow junction. In one embodiment, the surface comprises a silicon substrate of an in-process integrated circuit wafer and the junction being formed comprises one of a source or a drain of a MOS transistor.

A further step comprises conducting a PLAD operation to form a shallow, highly doped inner portion of the junction having a high concentration of dopants.

A further step comprises conducting a second doping operation to form a lightly doped outer portion of the junction. In one embodiment, this step comprises a conventional ion bombardment implantation doping operation with low power and low dopant dosage. The conventional ion bombardment implantation doping operation is typically conducted with a medium power implanter. The result of the conventional ion bombardment implantation doping operation is a lightly doped outer portion surrounding a heavily doped inner portion. The lightly doped outer portion has a bottom edge that is more even and straight than edges of junctions formed by PLAD. The lightly doped outer portion also has a lower concentration of dopants than the heavily doped inner portion.

Another step of the method of the present invention is to anneal the semiconductor wafer. The anneal causes a more even distribution of dopant concentration therein and helps to remove imperfections in the internal lattice structure. The anneal is an optional step that can be conducted after each doping operation, or after any of the doping operations.

The doping operation which forms a heavily doped inner portion and the doping operation which forms a lightly doped outer portion can be conducted in reverse order. This is useful in forming a thin oxide layer over the surface. One application for the thin oxide layer is as an implant barrier to the PLAD operation. When using an implant barrier, a conventional ion bombardment implantation doping operation is conducted first, and then the thin oxide layer is deposited using a process such as TEOS. The PLAD operation is then conducted through the thin oxide layer. Thus, the lightly doped outer portion is formed without the existence of the thin oxide layer, while the thin oxide layer is present to serve as an implant barrier to the PLAD operation. This use of a thin oxide layer as an implant barrier in this embodiment further reduces the depth of the dopants implanted in the PLAD operation, while maintaining the depth of the dopants implanted by the conventional ion bombardment implantation doping operation. The use of a thin oxide layer as an implant barrier also maintains the high concentration of dopants on the surface of the shallow junction in order to form a low resistance contact and interconnect interface.

The result of the method of the present invention is a shallow junction which is useful for forming diodes, resistors, and transistors. The junction has a variable profile gradation of dopants, with a first concentration of dopants in a heavily doped inner portion, and a second, lower concentration of dopants in the deeper lightly doped outer portion. The junction is also formed with an even bottom edge which, along with the variable profile gradation of dopants, helps to eliminate reverse bias current leakage. The variable profile gradation of dopants also helps to reduce underlap, and thereby helps to maintain a low threshold voltage without the need for forming spacers.

The method of the present invention has been found to be easily integrated into the manufacturing flow process and to be relatively inexpensive.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings, which will be briefly described below.

DETAILED DESCRIPTION OF THE PREFERRED EMBODIMENTS

The present invention involves the discovery by the inventors that by creating a shallow junction that has a variable concentration profile gradation of dopants with a PLAD operation, the prior art problems of conventional PLAD processes of jagged unevenness of the bottom component of the junction, excessive underlap of junctions below a MOS gate due to out diffusion of dopants, and reverse bias current leakage can be remedied Thus, the present invention comprises a method of forming a shallow junction on a silicon substrate using PLAD, which results in a junction with a variable concentration profile gradation of dopants for the formation of a less abrupt dopant concentration gradient termination at the bottom component of the junction. The term "variable concentration profile gradation of dopants," as used herein, refers to a junction in which different depths of the junction have different concentrations of dopants. Thus, the shallow junction has differing concentrations throughout. In one embodiment, the junction is formed with a heavily doped inner portion having a shallow depth and a high concentration of dopants, around which is formed a lightly doped outer portion having a greater depth and a lower concentration of dopants.

The method of the present invention is illustrated in FIGS. 3 through 6. The first step of the method of the present invention is the preparatory step of providing a semiconductor wafer having a surface on which to form the shallow junction. This is typically conducted at the junction doping stage of conventional integrated circuit manufacturing processes, typically after gate stacks are defined and before a passivation layer is formed over the defined gate stacks. Thus, in the embodiment seen in FIG. 3, a silicon substrate 20 is provided on an in-process integrated circuit wafer.

Figure 1:
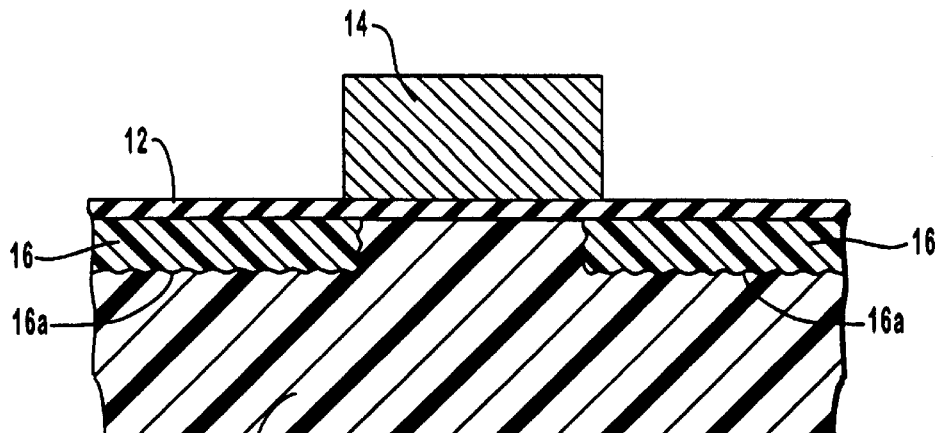
FIG. 1 is a cross-sectional depiction of a portion of an in-process integrated circuit wafer showing the results of a step of a conventional PLAD process of the prior art.
Figure 2:
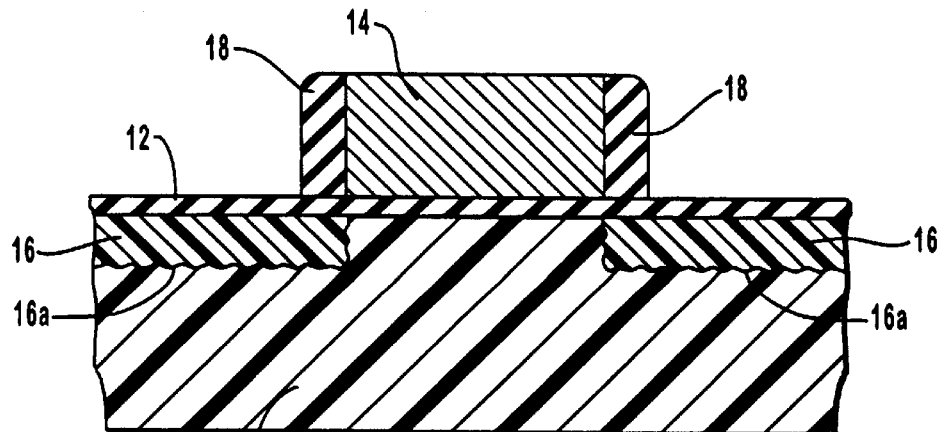
FIG. 2 is a cross-sectional depiction of a portion of an in-process integrated circuit wafer showing the results of a further step of the prior art PLAD process from that depicted in FIG. 1.
Figure 3:
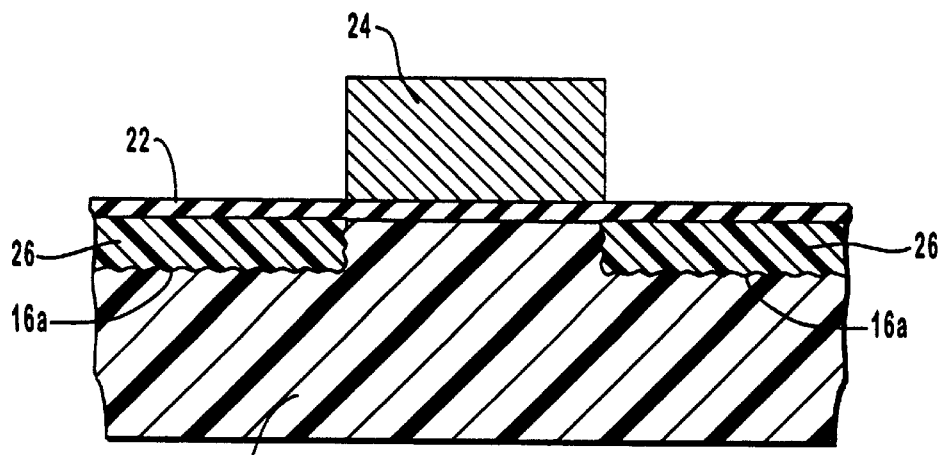
FIG. 3 is a cross-sectional depiction of a portion of an in-process integrated circuit wafer showing the results of a step of the method of the present invention.

In forming the partially completed gate structure of FIG. 3, gate oxide layer 22 is formed over silicon substrate 20. A gate region 24, which is formed over silicon substrate 10 and gate oxide layer 22, leaves exposed portions of silicon substrate 20 on which junctions will be formed.

The next step in the method of the present invention comprises conducting a PLAD operation to dope the exposed portion of silicon substrate 20, producing highly doped inner portions 26 having a depth of less than about 1000 angstroms. The PLAD operation is conducted in an energy range of about 5 KeV to about 15 KeV. Highly doped inner portions 26 will preferably be doped to a dopant concentration range of about $1 \times 10^{19}$ to about $5 \times 10^{21}$ atoms per $cm^3$. Any common dopant, such as boron or phosphorus, can be doped into silicon substrate 20. PLAD process machines are available from Varian Associates of Palo Alto, Calif., USA.

The PLAD operation is followed with a conventional ion bombardment implantation doping operation using dopants of the same type as were used for the PLAD operation. The conventional ion bombardment implantation doping operation is conducted without a plasma. Preferably, the conventional ion bombardment implantation doping operation is conducted at the higher energy range of between about 10 KeV and about 25 KeV using a medium current implanter. A medium current implanter is an implanter which operates in an energy range of about 0 to about 200 KeV, such as the E500 manufactured by Varian Associates of Palo Alto, Calif., USA.

The conventional ion bombardment implantation doping operation results in a set of junctions 30 with lightly doped outer portions 28 which extend to a greater depth than highly doped inner portions 26, and which have a lower concentration of dopants than highly doped inner portions 26. The concentration of dopants of lightly doped outer portions 28 is preferably in a range of about $1 \times 10^{16}$ to about $1 \times 10^{19}$ atoms per $cm^3$. Each of lightly doped outer portions 28 preferably will circumscribe and extend below and beyond a corresponding highly doped inner portions 26 by a depth in a range of about 250 angstroms to about 750 angstroms. The conventional ion bombardment implantation doping operation step will increase the dopant concentration in highly doped inner portions 26, and will also create lightly doped outer portions 28.

Due to the capability of conventional ion bombardment implantation doping operations of implanting with a more constant depth than PLAD processes, lightly doped outer portions 28 are formed with even an bottom component, rather than the jagged uneven bottom component formed by conventional PLAD processes. Thus, the lightly doped outer portion has an lower periphery 32, seen in FIG. 4, that is substantially planar and parallel to the silicon substrate.

An optional further step of the method of the present invention comprises annealing junctions 30. This anneal can be accomplished by conventional annealing processes, while conventional rapid thermal annealing (RTA) is preferred. Annealing achieves a normalizing of the doping gradient, helping to more evenly distribute dopants within highly doped inner portions 26 and lightly doped outer portions 28. Annealing can be conducted after one or more of the doping operations.

Figure 4:
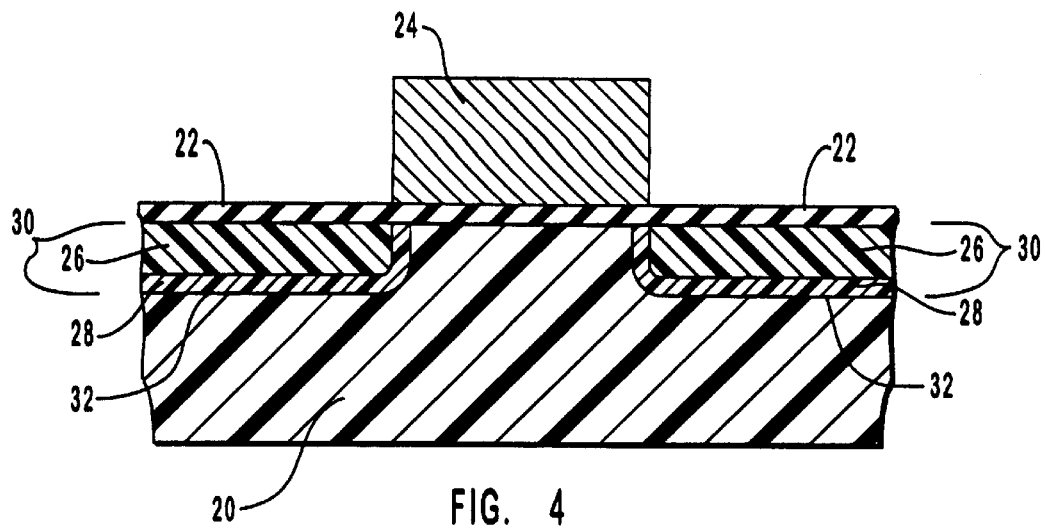
FIG. 4 is a cross-sectional depiction of a portion of an in-process integrated circuit wafer showing the results of a further step of the method of the present invention from that depicted in FIG. 3.

The foregoing steps result in the structure of FIG. 4, in which highly doped inner portions 26 and lightly doped outer portions 28 form junctions 30, each having a variable concentration profile gradation of dopants. As seen therein, lightly doped outer portions 28 slightly underlap gate region 24, but highly doped inner portions 26 do not substantially underlap gate region 24. This allows for a greater concentration of dopants injunction 30, while allowing only a minor portion of all dopants injunction 30 to underlap gate region 24. This helps to maintain a low threshold voltage without the need, as discussed in the Background Section above, for spacers on the side of the gate.

The structure of FIG. 4 also produces a less abrupt, more tailored doping concentration gradation with a variable dopant concentration profile which has been found to reduce reverse bias current leakage. Thus, the use of PLAD allows the formation of a shallow junction with a high dopant concentration close to the surface of silicon substrate 20, which helps to subsequently form lower resistance contacts and interconnects superadjacent thereto, while the method of the present invention eliminates the aforementioned problems with conventional PLAD processes.

Figure 5:
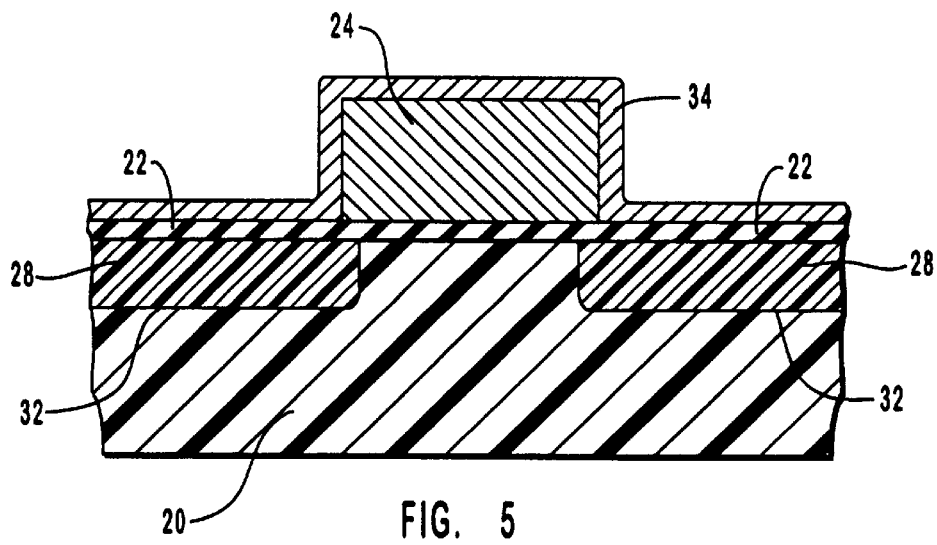
FIG. 5 is a cross-sectional depiction of a portion of an in-process integrated circuit wafer showing the results of a step of an alternate embodiment of the method of the present invention.
Figure 6:
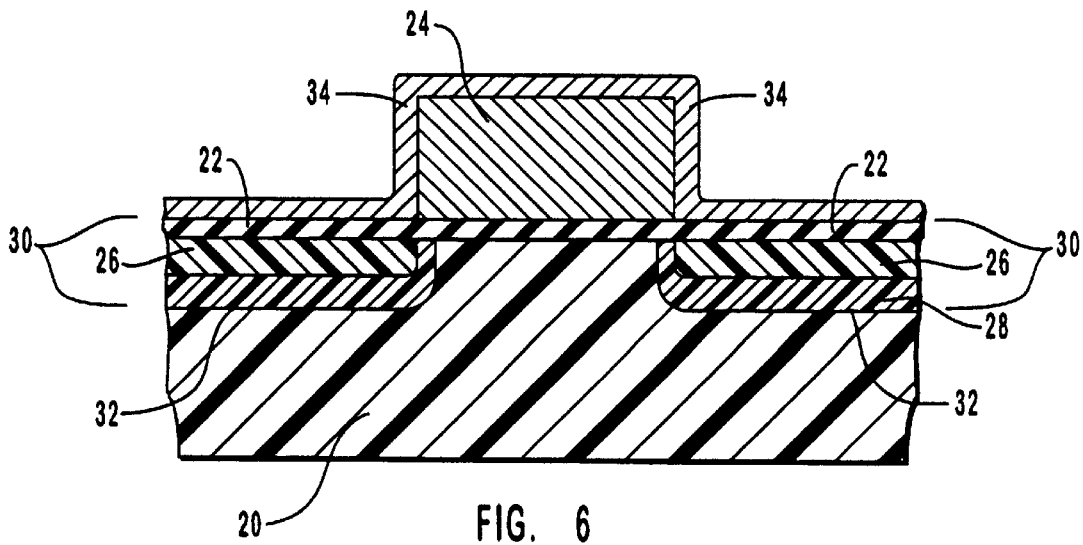
FIG. 6 is a cross-sectional depiction of a portion of an in-process integrated circuit wafer showing the results of a further step of the alternate embodiment of the method of the present invention from that depicted in FIG. 5.

In an alternative embodiment, the conventional ion bombardment implantation operation is conducted first to form lightly doped outer portions 28 as are seen in FIG. 5. Afterwards, a PLAD operation is conducted to form highly doped inner portions 26 as seen in FIG. 6. As with the embodiment described above, an anneal step can be performed after one or both of these two doping steps.

In the embodiment where the conventional ion bombardment implantation operation is conducted first, a thin oxide layer can be formed over gate region 24 and junction 30 prior to the PLAD operation and after the conventional ion bombardment implantation operation. By way of example, a TEOS layer 34 seen in FIG. 5 is formed, preferably having a thickness in a range of about 50 to about 100 angstroms. The PLAD operation is then conducted through TEOS layer 34, such that the structure of FIG. 6 results. When so doing, TEOS layer 34 serves as an implant barrier to the PLAD operation. The use of TEOS layer 34 as an in plant barrier further reduces the depth of highly doped inner portions 26 while maintaining the depth of lightly doped outer portions 28. The use of thin oxide layer 22 as an implant barrier also maintains the high concentration of dopants on the surface of junctions 30, for subsequent formation of a low resistance contact and interconnect interface.

The process of the present invention is useful in forming structures other than the gate structure of FIG. 6. Thus, in an alternative embodiment, both the conventional ion bombardment implantation operation and the PLAD operation are conducted in either order, with a thin oxide layer such as gate oxide layer 22 present on a surface such as silicon substrate 20 of an in-process integrated circuit wafer, so as to produce a shallow junction with a variable concentration profile gradation of dopants in the surface under the thin oxide layer.

The present invention can be used to form semiconductor devices such as resistors, diodes, and transistors. It is especially useful for forming MOS transistors, and can be used in forming both p-channel and n-channel MOS transistors. The method of the present invention has been found to be easily integrated into the manufacturing flow process and to be relatively inexpensive.

The method of the present invention solves several of the problems existing in conventional PLAD process implementations, and can be used to form a shallow junction with low resistivity for a contact and interconnect interface, such that a more densified and miniaturized integrated circuit can be formed. The method of the present invention also forms a junction with a more desirable variable concentration profile gradation of dopants with a smooth dopant concentration transition throughout the junction, and without significant junction underlap below a gate due to out diffusion, such that a low threshold voltage is maintained and reverse bias current leakage is substantially reduced.

The method of the present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An electrical device comprising:
   a semiconductor substrate having a top surface;
   a gate region over the semiconductor substrate, wherein the gate region has a bottom surface that is parallel to the top surface of the semiconductor substrate;
   a source/drain region for the gate region and situated within the semiconductor substrate, wherein the source/drain region has:
      a first portion that extends from a top surface of the semiconductor substrate to a depth of less than about 1000 angstroms and has a concentration of greater than $1 \times 10^{19}$ dopant atoms per $cm^3$, wherein said first portion does not underlap the bottom surface of the gate region that is parallel to the top surface of the semiconductor substrate; and
      a second portion that extends from the first portion an additional depth of about 250 angstroms to about 750 angstroms and has a concentration less than about $1 \times 10^{19}$ dopant atoms per $cm^3$, wherein said second portion underlaps the bottom surface of the gate region that is parallel to the top surface of the semiconductor substrate.

2. The electrical device as recited in claim 1, wherein the second portion has a lower periphery that extends within the semiconductor substrate to a depth in a range of between about 1250 angstroms and about 1750 angstroms.

3. The electrical device as recited in claim 1, wherein the semiconductor substrate is composed of silicon.

4. An electrical device comprising:
   a semiconductor substrate having a top surface;
   a gate region over the semiconductor substrate, wherein the gate region has a bottom surface that is parallel to the top surface of the semiconductor substrate;
   a source/drain region for the gate region and situated within the semiconductor substrate, wherein:
      the source/drain region has a first portion that extends from the top surface of the semiconductor substrate to a bottom periphery at a depth of less than about 1000 angstroms and has a concentration of $1 \times 10^{19}$ to about $5 \times 10^{21}$ dopant atoms per $cm^3$; and
      the source/drain region has a second portion that extends from the bottom periphery of the first portion to a range of between about 250 angstroms and about 750 angstroms and has a concentration less than about $1 \times 10^{19}$ dopant atoms per $cm^3$;
      the first portion of the source/drain region does not underlap the bottom surface of the gate region that is parallel to the top surface of the semiconductor substrate: and
      the second portion of the source/drain region underlaps the bottom surface of the gate region that is parallel to the top surface of the semiconductor substrate.

5. The electrical device as recited in claim 4, wherein the second portion of the source/drain region has a lower periphery that extends within the semiconductor substrate to a depth in a range of between about 1250 angstroms and about 1750 angstroms.

6. The electrical device as recited in claim 4, wherein the semiconductor substrate is composed of silicon.

7. The electrical device as recited in claim 4, wherein the second portion of the source/drain region has a lower periphery that is parallel to the top surface of the substrate.

8. An electrical device comprising:
   a semiconductor substrate having a top surface;
   a gate insulation layer on the top surface of the semiconductor substrate;
   a gate region on the gate insulation layer and having a bottom surface that is parallel to the top surface of the semiconductor substrate;
   a first source/drain region for the gate region and situated within the semiconductor substrate;
   a second source/drain region for the gate region and situated within the semiconductor substrate; wherein:
      the first source/drain has a first and a second portion and the second source/drain has a first and a second portion,
      each said first portion extends from the top surface of the semiconductor substrate to a bottom periphery at a depth of less than about 1000 angstroms and has a concentration of $1 \times 10^{19}$ to about $5 \times 10^{21}$ dopant atoms per $cm^3$, each said first portion does not underlap the bottom surface of the gate region that is parallel to the top surface of the semiconductor substrate, each said second portion extends from the bottom periphery of the respective first portion to a range of between about 250 angstroms and about 750 angstroms and has a concentration less than about $1\times10^{19}$ dopant atoms per cm$^3$, and each said second portion underlaps the bottom surface of the gate region that is parallel to the top surface of the semiconductor substrate.

9. The electrical device as recited in claim 8, wherein each said second portion has a lower periphery that extends within the semiconductor substrate to a depth in a range of between about 1250 angstroms and about 1750 angstroms.

10. The electrical, device recited in claim 8, wherein the semiconductor substrate is composed of silicon.

11. The electrical device as recited in claim 8, wherein each said second portion has a lower periphery that is parallel to the top surface of the substrate.

12. An electrical device comprising:

a semiconductor substrate having a top surface;

a gate region over the semiconductor substrate and having a bottom surface;

a source/drain region having:

a first portion that:

extends below the top surface of the semiconductor substrate;

does not underlap the bottom surface of the gate region; and has a dopant atom concentration;

a second portion that:

extends below the first portion of the source/drain region;

underlaps the bottom surface of the gate region; and has a dopant atom concentration less than that of the first portion, wherein:

the first portion of the source/drain region extends from the top surface of the semiconductor substrate to a bottom periphery at a depth of less than about 1000 angstroms and has a concentration of $1\times10^{19}$ to about $5\times10^{21}$ dopant atoms per cm$^3$; and the second portion of the source/drain region extends from the bottom periphery of the first portion in a range of between about 250 angstroms and about 750 angstroms and has a concentration less than about $1\times10^{19}$ dopant atoms per cm$^3$.

13. The electrical device as defined in claim 12, wherein:

the bottom surface of the gate region extends to terminate at a terminal region;

the first portion of the source/drain region extends to terminate at a terminal region; and a plane that is perpendicular to the bottom surface of the gate region that intersects the terminal region of the bottom surface of the gate region also intersects the terminal region of the first portion of the source/drain region.

14. The electrical device as defined in claim 12, wherein:

the bottom surface of the gate region extends to terminate at a planar lateral surface that extends above and is perpendicular to the bottom surface of the gate region;

the first portion of the source/drain region extends to terminate at a planar lateral surface that extends below and is perpendicular to the bottom surface of the gate region; and the planar lateral surface of the gate region is co-planar with the planar lateral surface of the first portion of the source/drain region.

15. The electrical device as defined in claim 12, wherein the semiconductor substrate is composed of silicon.

* * * * *

UNITED STATES PATENT AND TRADEMARK OFFICE
CERTIFICATE OF CORRECTION

PATENT NO.    : 6,359,310 B1
DATED         : March 19, 2002
INVENTOR(S)   : Fernando Gonzalez and Randhir Thakur It is certified that error appears in the above-identified patent and that said Letters Patent is hereby corrected as shown below:

Column 2,
Line 44, change "out diffusion" to -- outdiffusion --

Column 5,
Line 13, after "remedied" insert a period

Column 6,
Line 19, before "bottom" change "even an" to -- an even --
Line 42, change "injunction" to -- in junction --

Column 7,
Lines 38-39, change "out diffusion" to -- outdiffusion --
Line 45, change "illustrated" to -- illustrative --

Signed and Sealed this

Thirtieth Day of July, 2002

*Attest:*

JAMES E. ROGAN
*Attesting Officer*     *Director of the United States Patent and Trademark Office*